United States Patent [19]
Kiyono

[11] Patent Number: 5,535,154
[45] Date of Patent: Jul. 9, 1996

[54] SEMICONDUCTOR MEMORY DEVICE WITH CMOS-INVERTER STORAGE CELLS

[75] Inventor: Junji Kiyono, Tokyo, Japan

[73] Assignee: NEC Corporation, Tokyo, Japan

[21] Appl. No.: 362,159

[22] Filed: Dec. 22, 1994

[30] Foreign Application Priority Data

Dec. 22, 1993 [JP] Japan .................................. 5-324990

[51] Int. Cl.$^6$ ................................................ G11C 11/40
[52] U.S. Cl. .................................... 365/145; 365/154
[58] Field of Search ..................................... 365/182, 145, 365/154, 156; 257/903, 67, 60, 69

[56] References Cited

U.S. PATENT DOCUMENTS

| | | | |
|---|---|---|---|
| 5,361,224 | 11/1994 | Takasu | 365/154 |
| 5,426,315 | 6/1995 | Pfiester | 257/67 |

OTHER PUBLICATIONS

H. Ohkubo et al., "16 Mbit SRAM Cell Technologies for 2.0 V Operation", IEDM 1991, pp. 481–484.

*Primary Examiner*—A. Zarabian
*Attorney, Agent, or Firm*—Sughrue, Mion, Zinn, Macpeak & Seas

[57] ABSTRACT

A semiconductor memory device in which each storage cell can maintain its content or data value stored therein even if power is lost, and the content or data value thus maintained can be produced when power is on. Each storage cell has first and second CMOS inverters constituting a flip-flop circuit. The first inverter is composed of a first MOS driver transistor and a first thin-film load transistor. The second inverter is composed of a second MOS driver transistor and a second thin-film load transistor. The first and second load transistors have control gate electrodes and ferroelectric PZT films, respectively. The PZT films are dielectrically polarized by voltages applied to the control gate electrodes, so that the threshold voltage difference is generated between the first and second thin-film transistors. Due to the threshold voltage difference, the preceding content or state of the cell is maintained, and then, it can be reproduced when power is supplied again.

16 Claims, 8 Drawing Sheets

SEMICONDUCTOR MEMORY DEVICE WITH CMOS-INVERTER STORAGE CELLS

BACKGROUND OF THE INVENTION

1. Field of the Invention

The present invention relates to a semiconductor memory device and more particularly, to a semiconductor memory device such as a static random-access memory (SRAM), in which each storage cell has a pair of complementary metal-oxide-semiconductor (CMOS) inverters providing a flip-flop circuit function.

2. Description of the Prior Art

A conventional SRAM has such a storage cell as shown in FIGS. 1A and 1B, FIGS. 2A and 2B, and FIG. 3. This cell is disclosed in 1991 IEDM Technical Digest, pp 481–484.

A circuit diagram of each storage cell of the conventional SRAM is shown in FIG. 3. There are first and second n-channel bulk MOS field-effect transistors (MOSFETs) 58 and 59 as driver transistors, first and second p-channel thin-film transistors (TFTs) 60 and 61 as load transistors, and third and fourth n-channel bulk MOS field-effect transistors 56 and 57 as access transistors.

Gates of the first driver MOS transistor 58 and the first load thin-film transistor 60 are coupled together, and drains or the first driver transistor 58 and the first load transistor 60 are coupled together. A source of the first driver transistor 58 is connected with the ground and a source of the first load transistor 60 is connected with a voltage source (supply voltage: $V_{CC}$). Thus, the transistors 58 and 60 constitute a first CMOS inverter. The coupled gates of the transistors 58 and 60 form an input end of the first inverter, and their coupled drains form an output end thereof.

Similarly, gates of the second driver MOS transistor 59 and the second load thin-film transistor 61 are coupled together, and drains of the second driver transistor 59 and the second load transistor 61 are coupled together. A source of the second driver transistor 59 is connected with the ground and a source of the second load transistor 61 is connected with the voltage source. Thus, the transistors 59 and 61 constitute a second CMOS inverter. The coupled gates of the transistors 59 and 61 form an input end of the second inverter, and their coupled drains form an output end thereof.

The input end of the second inverter is connected with the output end of the first inverter and with a source of the first access transistor 56. A drain of the transistor 56 is connected with a first bit line 48-1 corresponding to this cell, and a gate thereof is connected with a word line W' corresponding to this cell.

The output end of the second inverter is connected with the input end of the first inverter and with a source of the second access transistor 57. A drain of the transistor 57 is connected with a second bit line 48-2 corresponding to this cell, and a gate thereof is connected with the word line W'.

The first and second inverters thus structured provide a flip-flop circuit function to store a data value therein.

The above storage cell is realized on a semiconductor substrate as follows:

FIGS. 1A and 1B show the plan view and the cross-sectional view of the storage cell, respectively.

As shown in FIG. 1B, a field insulator film 42 is selectively formed on a p-type silicon substrate 41 to form an isolation region thereon, providing active regions isolated by the isolation region on the substrate 41. A gate insulator film 44 is formed on the respective active regions at positions corresponding to gate electrodes of the MOS transistors 56, 57, 58 and 59.

FIG. 2A shows the layout of the bulk MOS transistors 56, 57, 58 and 59.

As shown in FIG. 2A, source and drain regions of the first driver MOS transistor 58 are made of $n^+$-type diffusion regions 46e and 46a formed in self-align to a gate electrode 45a in the substrate 41, respectively. The gate electrode 45a of the transistor 58 is formed on the gate insulator film 44 between the diffusion regions 46e and 46a.

Source and drain regions of the second driver MOS transistor 59 are made of $n^+$-type diffusion regions 46f and 46b formed in self-align to a gate electrode 45b in the substrate 41, respectively. The gate electrode 45b of the transistor 59 is formed on the gate insulator film 44 between the diffusion regions 46f and 46b.

Source and drain regions of the first access MOS transistor 56 are made of the $n^+$-type diffusion region 46a and an $n^+$-type diffusion region 46c formed in self-align to a gate electrode 45c in the substrate 41, respectively. The diffusion region 46a is sued for both of the transistors 56 and 58, in other words, the source region of the transistor 56 is connected with the drain region of the transistor 58. The diffusion region 46c as the drain region of the transistor 56 is connected with the first bit line 48-1 through a contact hole 47a. The hole 47a is formed to penetrate a first interlayer insulator film 67, a gate insulator film 50 for the thin-film transistors 60 and 61, and a second interlayer insulator film 68, as shown in FIG. 1B. The first bit line 48-1 is formed on the second interlayer insulator film 68.

The gate electrode 45c of the transistor 56 is formed on the gate insulator film 44 between the diffusion regions 46a and 46c. The gate electrode 45c is formed to be integrated with the word line W' corresponding to this cell.

Source and drain regions of the second access MOS transistor 57 are made of the $n^+$-type diffusion region 46b and an $n^+$-type diffusion region 46d formed in self-align to a gate electrode 45d in the substrate 41, respectively. The diffusion region 46b is used for both of the transistors 57 and 59, in other words, the source region of the transistor 57 is connected with the drain region of the transistor 59. The diffusion region 46d as the drain region of the transistor 57 is connected with the second bit line 48-2 through a contact hole 47b. The hole 47b also is formed to penetrate the first interlayer insulator film 67, the gate insulator film 50 for the thin-film transistors 60 and 61, and the second interlayer insulator film 68.

The gate electrode 45d of the transistor 57 is formed on the gate insulator film 44 between the diffusion regions 46b and 46d. The gate electrode 45d is formed to be integrated with the word line W'.

As shown in FIG. 1B, the first interlayer insulator film 67 is formed on the substrate 41 to cover the $n^+$-type diffusion regions 46a, 46b, 46c, 46d, 46e and 46f of the bulk MOS transistors 56, 57, 58 and 59, the gate electrode 45a, 45b, 45c and 45d thereof, and the field insulator film 42.

As shown in FIG. 1A, 1B and 2A, two contact holes 43a and 43b are formed in the gate insulator film 44, and two $n^+$-type diffusion regions 69 are formed in the substrate 41 at positions right below the contact holes 43a and 43b, respectively. The diffusion regions 69 are connected with the adjacent $n^+$-type diffusion regions 46a and 46b, respectively, so that the gate electrode 45b of the transistor 59 is connected with the diffusion region 46a through the contact hole 43a and the gate electrode 45a of the transistor 58 is connected with the diffusion region 46b through the contact hole 43b.

Next, the structures of the first and second thin-film transistors 60 and 61 are described referring to FIGS. 1B and 2B.

As shown in FIG. 1B, the first and second thin-film transistors 60 and 61 are formed on the first interlayer insulator film 67. Gate electrodes 49a and 49b for the transistors 60 and 61 are formed on the first interlayer insulator film 67. The gate electrode 49a of the transistor 60 is connected with the corresponding diffusion region 69 through a contact hole 54b of the first interlayer insulator film 67. Thus, the gate electrode 49a is electrically connected with the diffusion region 46b. The gate electrode 49b of the transistor 61 is connected with the corresponding diffusion region 69 through a contact hole 54a of the first interlayer insulator film 67. Thus, the gate electrode 49b is electrically connected with the diffusion region 46a.

The gate insulator film 50 for the transistors 60 and 61 is formed on the first interlayer insulator film 67 to cover the gate electrode 49a and 49b.

Source and drain regions 51a and 52a and a channel region 53a of the transistor 60 are formed by a polysilicon film. The polysilicon film is produced by the step of depositing an amorphous silicon film on the gate insulator film 50, the step of patterning the amorphous silicon film, and the step of annealing the amorphous film thus patterned so that this film is crystallized to be a polycrystalline silicon film with large-size grains. The source and drain regions 51a and 52a are doped with an impurity to be of a $p^+$-type. The channel region 53a is doped with no impurity.

The drain region 52a of the transistor 60 is connected with the gate electrode 49b of the transistor 61 through a contact hole 64a of the gate insulator film 50. The source region 51a thereof is connected with a power supply line 55.

Similarly, source and drain regions 51b and 52b and a channel region 53b of the transistor 61 are formed by a polysilicon film. The polysilicon film is produced by the same way as the case of the transistor 60. The source and drain regions 51b and 52b are doped with an impurity to be of a $p^+$-type. The channel region 53b is doped with no impurity.

The drain region 52b of the transistor 61 is connected with the gate electrode 49a of the transistor 60 through a contact hole 64b of the gate insulator film 50. The source region 51b thereof is connected with the power supply line 55.

The thin-film transistors 60 and 61 are covered with the second interlayer insulator film 68. The first and second bit lines 48-1 and 48-2 are formed on the film 68.

As described above, the storage cell of the conventional SRAM having the circuit of FIG. 3 is realized on the semiconductor substrate 41.

With the storage cell of the conventional SRAM, a data value is stored by using the electric potential difference at a node A', i.e., the diffusion region 46a and a node B', i.e., the diffusion region 46b. As a result, there is a problem that the content of the cell or the data value stored therein is destroyed if the supply voltage decreases drastically or if power is lost. This means that continuous power at a level higher than a specified one is essentially required for maintaining the stored data value.

SUMMARY OF THE INVENTION

Accordingly, an object of the present invention is to provide a semiconductor memory device in which each storage cell can maintain its content or data value stored therein even if power is lost, and the content or data value thus maintained can be reproduced when power is supplied again.

A semiconductor memory device according to the present invention contains a plurality of storage cells, each of which has a first CMOS inverter having a first input end and a first output end, and a second CMOS inverter having a second input end and a second output end. The first input end is connected with the second output end and second input end is connected with the first output end. The first and second inverters constitute a flip-flop circuit.

The first CMOS inverter is composed of a first MOS driver transistor of a first conductivity type and a first thin-film load transistor of a second conductivity type opposite in polarity to the first conductivity type.

The first thin-film load transistor has a first channel region formed between first pair of source/drain regions, a first gate electrode formed to be opposite to the first channel region through a first gate insulator film, and a first control electrode formed to be opposite to the first channel region through a first ferroelectric insulator film.

The second CMOS inverter is composed of a second MOS driver transistor of the first conductivity type and a second thin-film load transistor of the second conductivity type.

The second thin-film load transistor has a second channel region formed between a second pair of source/drain regions, a second gate electrode formed to be opposite to the second channel region through a second gate insulator film, and a second control electrode formed to be opposite to the second channel region through a second ferroelectric insulator film.

The first and second ferroelectric insulator films are dielectrically polarized by applying voltages to the first and second control electrodes, so that a threshold voltage difference is generated between the first and second thin-film transistors. A content of the storage cell is maintained due to the threshold voltage difference.

As the ferroelectric insulator film, a PZT film may be preferably used. However, any other materials may be used if they have ferroelectricity (for example, the dielectric constant is 100 or more) sufficient for generating the threshold voltage difference.

In a preferred embodiment, the first gate electrode and the first control electrode are coupled together and the second gate electrode and the second control electrode are coupled together.

In another preferred embodiment, the first gate electrode and the first control electrode are not coupled together, and the first control electrode is applied with a control voltage. The second gate electrode and the second control electrode are not coupled together, and the second control electrode is applied with a control voltage.

With the semiconductor memory device according to the invention, the first and second ferroelectric films are dielectrically polarized by the voltages applied to the first and second control electrodes. Therefore, a threshold voltage difference is generated between the first and second thin-film transistors.

As a result, when power is on, one of the first and second inverters generates a high-level output and the other generates a low-level output according to the threshold voltage difference, so that the preceding content of the storage cell, i.e., the stored data value when power was off is reproduced. This means that the preceding content can be maintained in spite of power off or power reduction.

DETAILED DESCRIPTION OF THE PREFERRED EMBODIMENT

Preferred embodiments of the present invention will be described below referring to FIGS. 4A and 4B, FIGS. 5A and 5B, FIG. 6, FIGS. 7A and 7B and FIG. 8 attached.

First Embodiment

Figure 4A:
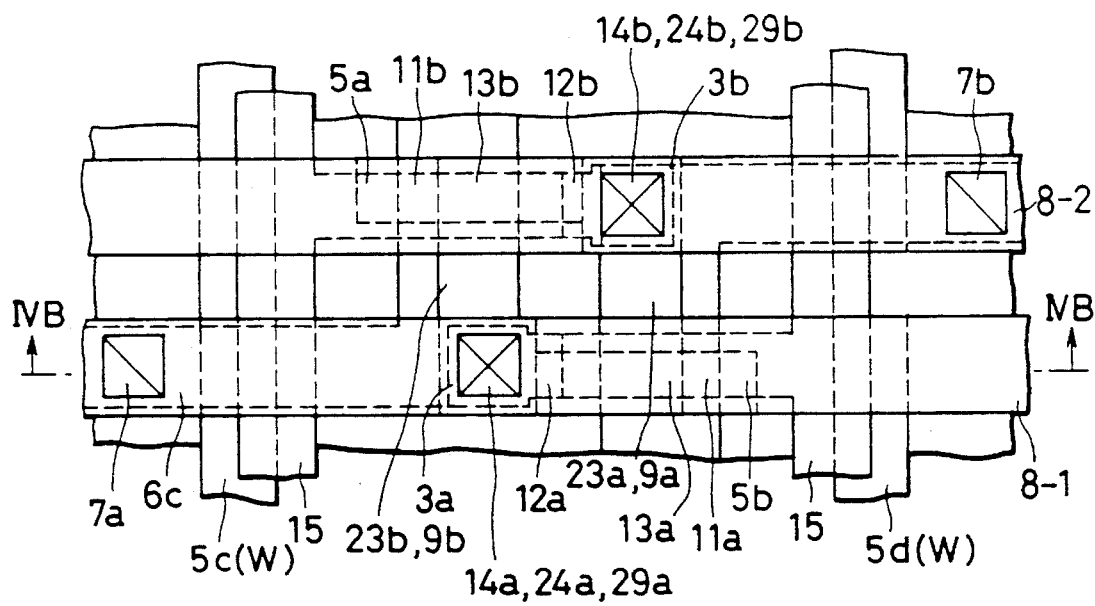
FIG. 4A is a partial plan view showing a storage cell of a semiconductor memory device according to a first embodiment of the invention.
Figure 4B:
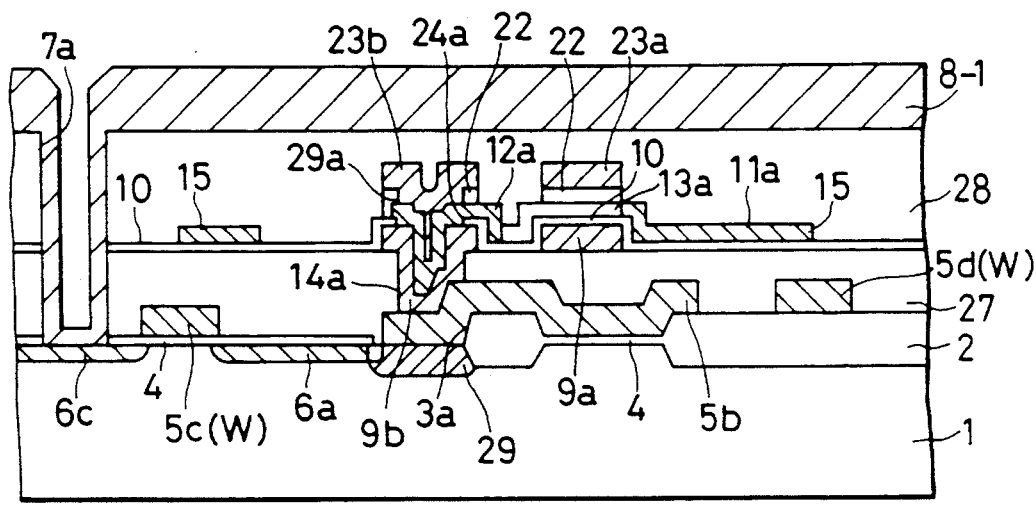
FIG. 4B is a partial cross-sectional view along the line IVB—IVB of FIG. 4A.
Figure 5A:
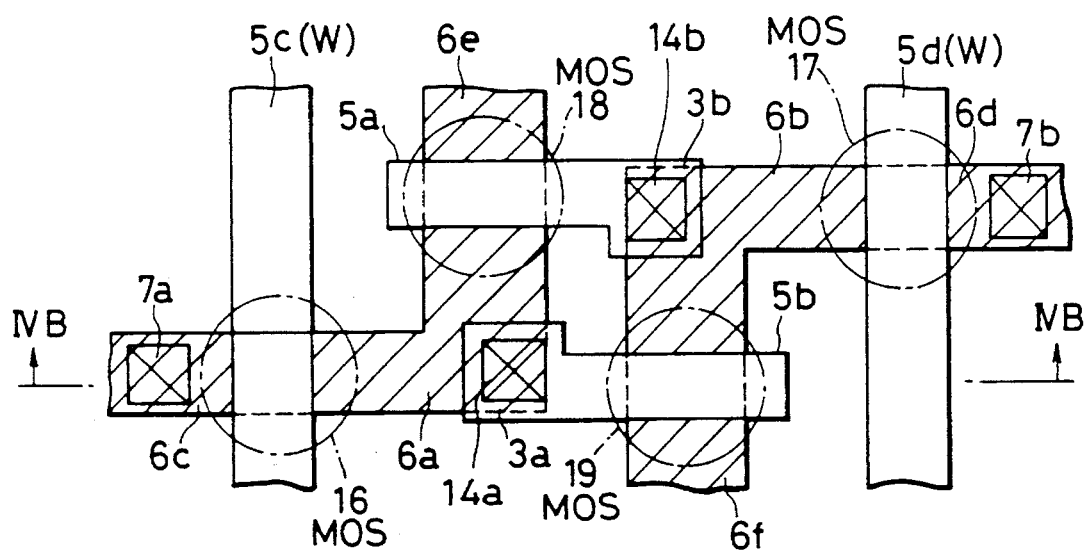
FIG. 5A is a partial plan view showing the layout of the bulk MOS driver and access transistors of the storage cell according to the first embodiment.
Figure 5B:
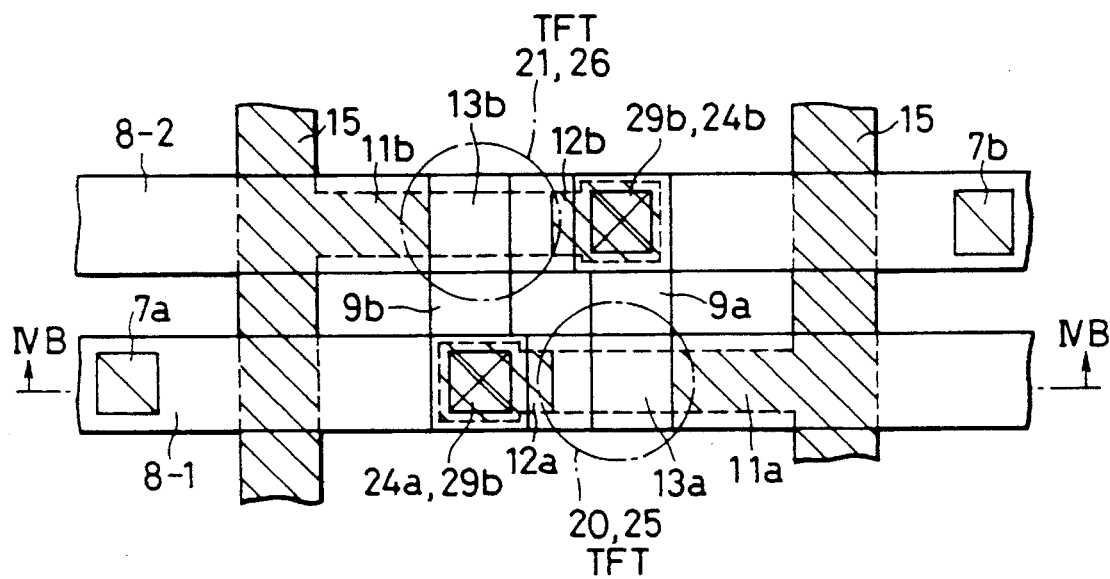
FIG. 5B is a partial plan view showing the layout of the thin-film load transistors of the storage cell according to the first embodiment.
Figure 6:
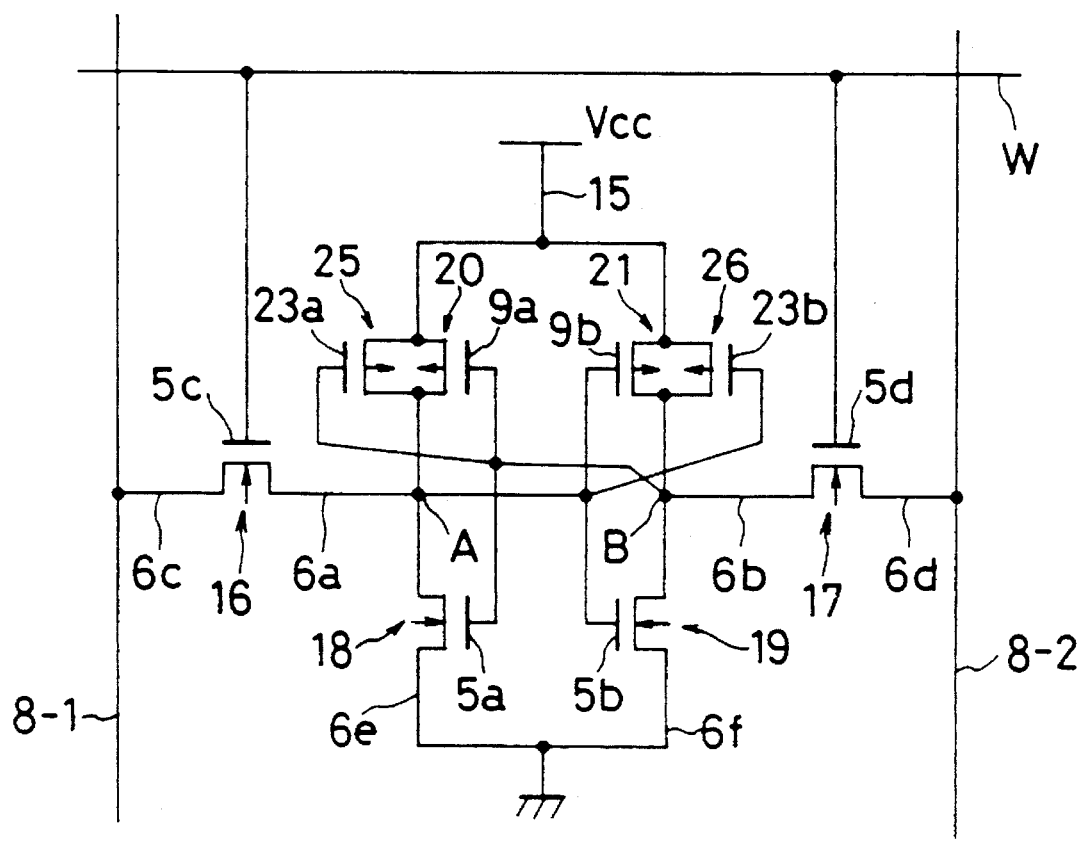
FIG. 6 is a circuit diagram of the storage cell of the semiconductor memory device according to the first embodiment.

FIGS. 4A and 4B and FIGS. 5A and 5B show an SRAM according to a first embodiment of the invention, each storage cell of which has a circuit diagram shown in FIG. 6.

Circuit Configuration

In FIG. 6, first and second n-channel bulk MOS field-effect transistors 18 and 19 act as driver transistors of this cell. First and second p-channel thin-film transistors 20 and 21 act as load transistors for the transistors 18 and 19, respectively. Third and fourth n-channel bulk MOS field-effect transistors 16 and 17 act as access transistors for the combination of the transistors 18 and 20, and that of the transistors 19 and 21, respectively.

Figure 1A:
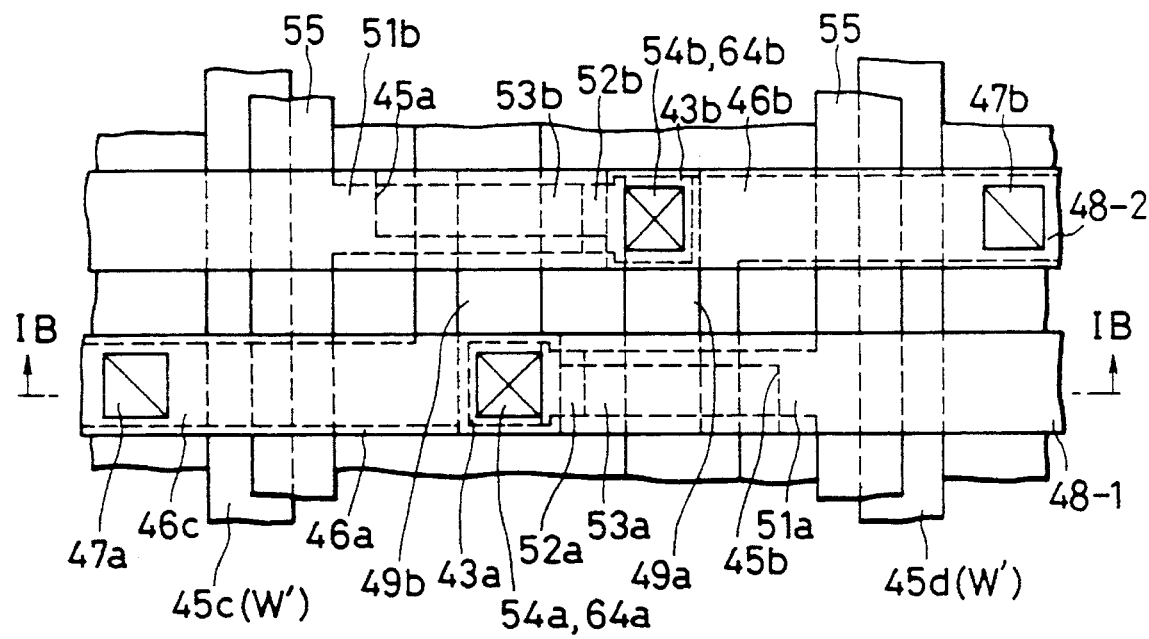
FIG. 1A is a partial plan view showing a storage cell of a conventional semiconductor memory device.
Figure 1B:
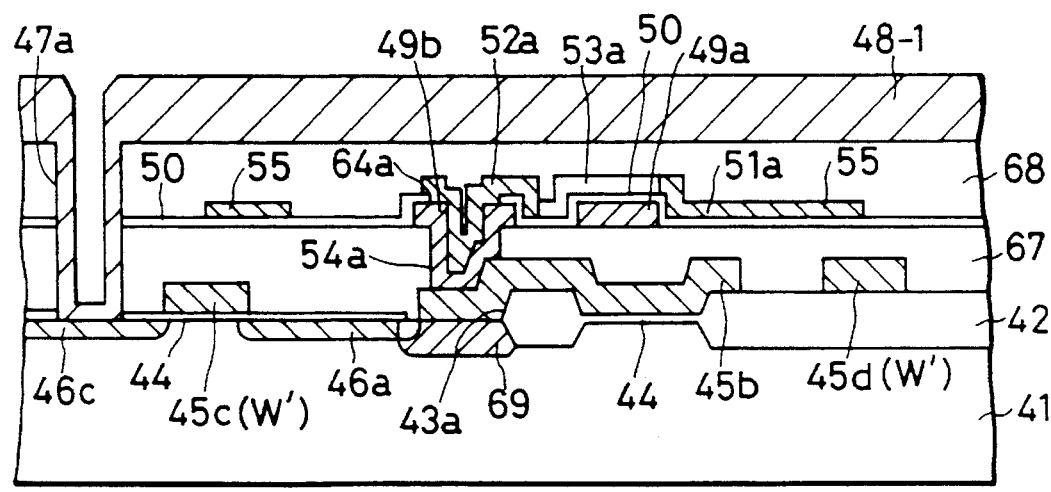
FIG. 1B is a partial cross-sectional view along the line IB—IB of FIG. 1A.
Figure 2A:
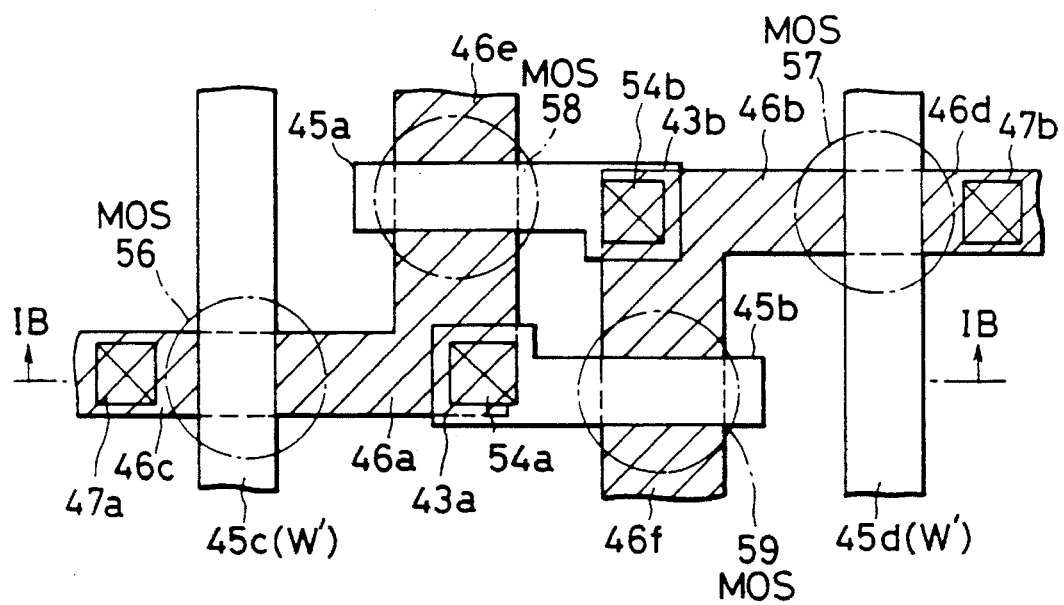
FIG. 2A is a partial plan view showing the layout of the bulk MOS driver and access transistors of the storage cell shown in FIG. 1A.
Figure 2B:
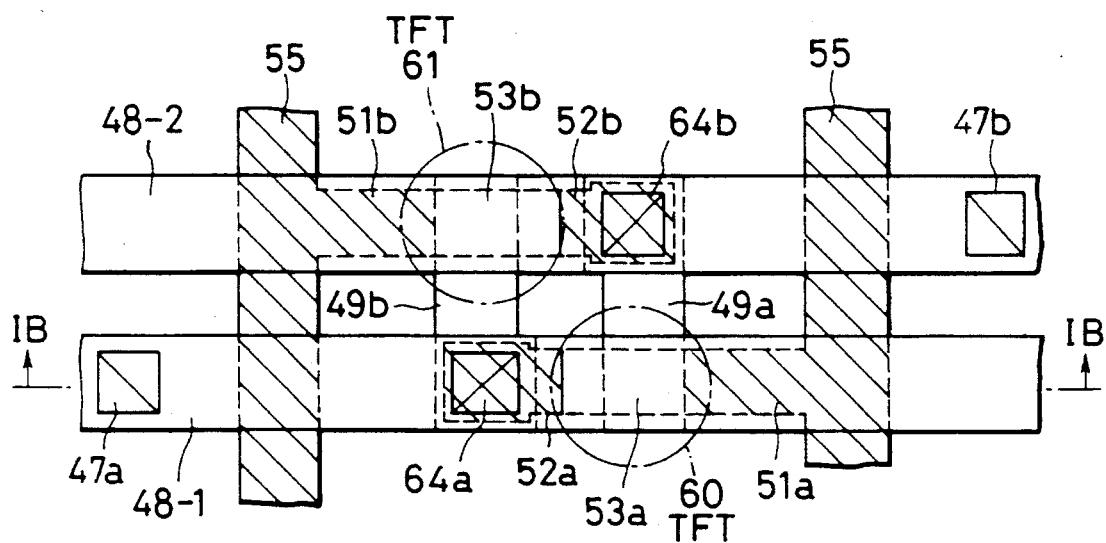
FIG. 2B is a partial plan view showing the layout of the thin-film load transistors of the storage cell shown in FIG. 1A.
Figure 3:
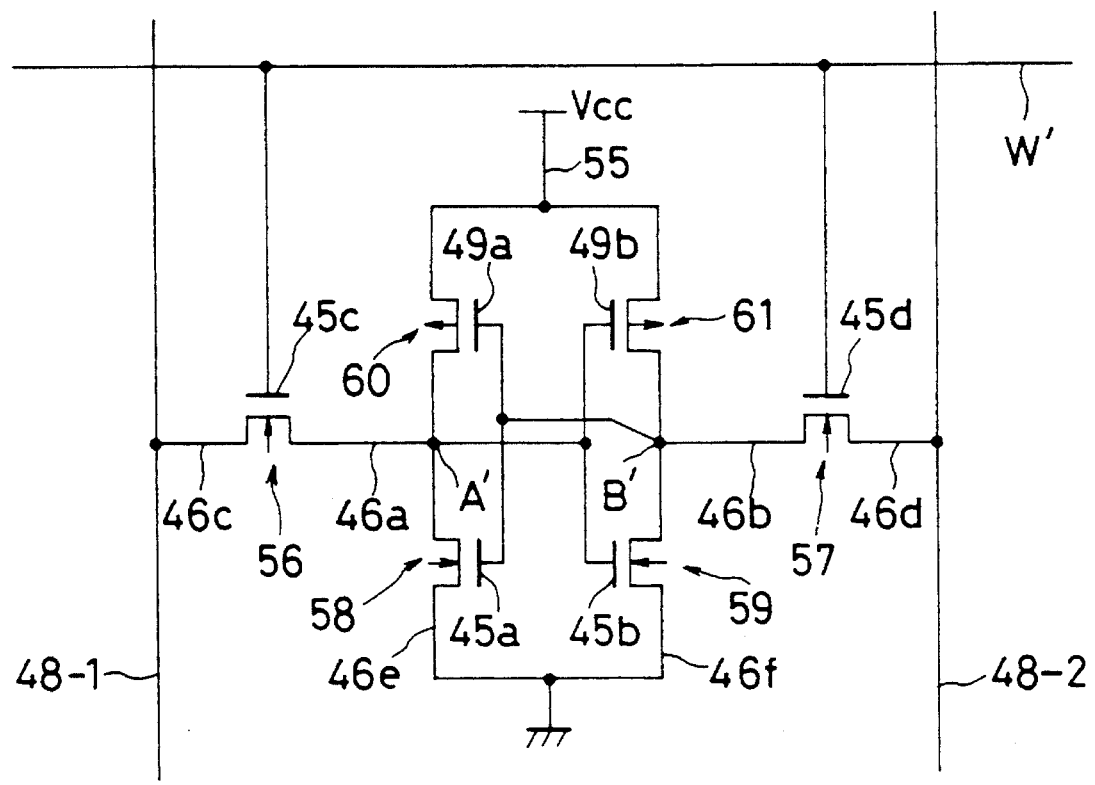
FIG. 3 is a circuit diagram of the storage cell of the conventional semiconductor memory device.

Different from the conventional storage cell shown in FIG. 3, the first load transistor 20 has a gate electrode and a control electrode that are coupled together. The second load transistor 21 also has a gate electrode and a control electrode that are coupled together. The gate electrodes are used for popular load operation. The control gate electrodes are used for data maintaining operation.

A gate of the first driver MOS transistor 18 is connected with the first gates of the first load transistor 20. Drains of the first driver transistor 18 and the first load transistor 20 are coupled together. A source of the first driver transistor 18 is connected with the ground and a source of the first load transistor 20 is connected with a voltage source (supply voltage: $V_{CC}$). Thus, the transistors 18 and 20 constitute a first CMOS inverter. The coupled gates of the transistors 18 and 20 form an input end of the first inverter, and the coupled drains form an output end thereof.

Similarly, a gate of the second driver MOS transistor 19 is connected with the first and second gates of the second load transistor 21. Drains of the second driver transistor 19 and the second load transistor 21 are coupled together. A source of the second driver transistor 19 is connected with the ground and a source of the second load transistor 21 is connected with the voltage source. Thus, the transistors 19 and 21 constitute a second CMOS inverter. The coupled gates of the transistors 19 and 21 form an input end of the second inverter, and the coupled drains form an output end thereof.

The input end of the second inverter is connected with the output end of the first inverter and with a source of the first access transistor 16. A drain of the transistor 16 is connected with a first bit line 8-1 corresponding to this cell, and a gate thereof is connected with a word line W corresponding to this cell.

The output end of the second inverter is connected with the input end of the first inverter and to a source of the second access transistor 17. A drain of the transistor 17 is connected with a second bit line 8-2 corresponding to this cell, and a gate thereof is connected with the word line W.

The first and second inverters thus structured provide a flip-flop circuit function to store a data value therein.

Structures of the Bulk MOS Transistors

The above storage cell is realized on a semiconductor substrate as follows:

FIG. 4B shows the cross section of the storage cell.

As shown in FIG. 4B, a field insulator film 2 of $SiO_2$ is selectively formed on a p-type silicon substrate 1 to form an isolation region thereon, providing active regions isolated by the isolation region on the substrate 1. A gate insulator film 4 of $SiO_2$ is formed on the respective active regions at positions corresponding to gate electrodes of the MOS transistors 16, 17, 18 and 19.

FIG. 5A shows the layout of the bulk MOS transistors 16, 17, 18 and 19.

As shown in FIG. 5A, source and drain regions of the first driver MOS transistor 18 are made of $n^+$-type diffusion regions 6e and 6a formed in self-align to a polysilicon gate electrode 5a in the substrate 1, respectively. The gate electrode 5a of the transistor 18 is formed on the gate insulator film 4 between the diffusion regions 6e and 6a.

Source and drain regions of the second driver MOS transistor 19 are made of $n^+$-type diffusion regions 6f and 6b formed in self-align to a polysilicon gate electrode 5b in the substrate 1, respectively. The gate electrode 5b of the transistor 19 is formed on the gate insulator film 4 between the diffusion regions 6f and 6b.

Source and drain regions of the first access MOS transistor 16 are made of the $n^+$-type diffusion region 6a and an n+-type diffusion region 6c formed in self-align to a polysilicon gate electrode 5c in the substrate 1, respectively. The diffusion region 6a is used for both of the transistors 16 and 18, in other words, the source region of the transistor 16 is connected with the drain region of the transistor 18. The diffusion region 6c as the drain region of the transistor 16 is connected with the first bit line 8-1 through a contact hole 7a. The bit line 8-1 is made of aluminum (Al). The hole 7a is formed to penetrate a first interlayer insulator film 27 made of boron-doped phosphosilicate glass (BPSG), a gate insulator film 10 for the thin-film transistors 20 and 21, which is made of SiO$_2$, and a second interlayer insulator film 28 made of BPSG, as shown in FIG. 4B. The first bit line 8-1 is formed on the second interlayer insulator film 28.

The gate electrode 5c of the transistor 16 is formed on the gate insulator film 4 between the diffusion regions 6a and 6c. The gate electrode 5c is formed to be integrated with the word line W corresponding to this cell.

Source and drain regions of the second access MOS transistor 17 are made of the n+-type diffusion region 6b and an n+-type diffusion region 6d formed in self-align to a gate electrode 5d in the substrate 1, respectively. The diffusion region 6b is used for both of the transistors 17 and 19, in other words, the source region of the transistor 17 is connected with the drain region of the transistor 19. The diffusion region 6d as the drain region of the transistor 17 is connected with the second bit line 8-2 through a contact hole 7b. The bit line 8-2 is made of Al. The hole 7b is formed to penetrate the first interlayer insulator film 27, the gate insulator film 10 for the thin-film transistors 20 and 21, and the second interlayer insulator film 28.

The gate electrode 5d of the transistor 17 is formed on the gate insulator film 4 between the diffusion regions 6b and 6d. The gate electrode 5d is formed to be integrated with the word line W.

As shown in FIG. 4B, the first interlayer insulator film 27 is formed over the substrate 1 to cover the n+-type diffusion regions 6a, 6b, 6c, 6d, 6e and 6f of the bulk MOS transistors 16, 17, 18 and 19, the gate electrode 5a, 5b, 5c and 5d thereof, and the field insulator film 2.

As shown in FIG. 4A, 4B and 5A, two contact holes 3a and 3b are formed in the gate insulator film 4, and two n+-type diffusion regions 29 are formed in the substrate 1 at positions right below the contact holes 3a and 3b, respectively. The diffusion regions 29 are connected with the adjacent n+-type diffusion regions 6a and 6b, respectively, so that the gate electrode 5b of the transistor 19 is connected with the diffusion region 6a through the contact hole 3a and the gate electrode 5a of the transistor 18 is connected with the diffusion region 6b through the contact hole 3b.

Structures of the Thin-film Transistors

Next, the structures of the first and second thin-film transistors 20 and 21 are described referring to FIGS. 4B and 5B.

As shown in FIG. 4B, the first and second thin-film transistors 20 and 21 are formed on the first interlayer insulator film 27. Gate electrodes 9a and 9b for the transistors 20 and 21 are formed on the first interlayer insulator film 27. The gate electrode 9a of the transistor 20 is connected with the corresponding diffusion region 29 through a contact hole 14b of the first interlayer insulator film 27. Thus, the gate electrode 9a is electrically connected with the diffusion region 6b. Similarly, the gate electrode 9b of the transistor 21 is connected with the corresponding diffusion region 29 through a contact hole 14a of the first interlayer insulator film 27. Thus, the gate electrode 9b is electrically connected with the diffusion region 6a.

The gate insulator film 10 for the transistors 20 and 21 is formed on the first interlayer insulator film 27 to cover the gate electrode 9a and 9b. The film 10 is made of an SiO$_2$ film.

Source and drain regions 11a and 12a and a channel region 13a of the transistor 20 are formed by a patterned polysilicon film. The polysilicon film is produced by the step of depositing an amorphous silicon film on the gate insulator film 10, the step of patterning the amorphous silicon film, and the step of annealing the amorphous film thus patterned so that this film is crystallized to be a polycrystalline silicon film with large-size grains. The source and drain regions 11a and 12a are doped with an impurity to be of a p+-type by ion-implantation. The channel region 13a is doped with no impurity.

The drain region 12a of the transistor 20 is connected with the gate electrode 9b of the transistor 21 through a contact hole 24a of the gate insulator film 10. The source region 11a thereof is connected with a power supply line 15.

Similarly, source and drain regions 11b and 12b and a channel region 13b of the transistor 21 are formed by a patterned polysilicon film. The polysilicon film is produced by the same way as the case of the transistor 20. The source and drain regions 11b and 12b are doped with an impurity to be of a p+-type by ion-implantation. The channel region 13b is doped with no impurity.

The drain region 12b of the transistor 21 is connected with the gate electrode 9a of the transistor 20 through a contact hole 24b of the gate insulator film 10. The source region 11b thereof is connected with the power supply line 15.

Further, patterned ferroelectric insulator films 22 made of lead zirconate titanate (PZT) are formed on the channel regions 13a and 13b, respectively. On these insulator films 22, control electrodes 23a and 23b made of polysilicon are further formed to be opposite to the channel regions 13a and 13b, respectively.

The ferroelectric insulator films 22 act like second gate insulator films for the control electrodes 23a and 23b, respectively. In other words, the control electrode 23a and the ferroelectric insulator film 22 constitute a third thin-film transistor 25 together with the common source and drain regions 11a and 12a and the common channel region 13a corresponding to the electrode 23a, in addition to the first thin-film transistor 20. Similarly, the control electrode 23b and the ferroelectric film 22 constitute a fourth thin-film transistor 26 together with the common source and drain regions 11b and 12b and the common channel region 13b corresponding to the electrode 23b, in addition to the second thin-film transistor 21.

The control electrode 23a and the ferroelectric insulator film 22 corresponding thereto are the same in plan shape as each other and they are also the same in plan shape as that of the first gate electrode 9a disposed at an opposite side to the second gate electrode 23a. Similarly, the control electrode 23b and the insulator film 22 corresponding thereto are the same in plan shape as each other and they are also the same in plan shape as that of the gate electrode 9b disposed at an opposite side to the electrode 23b.

The thin-film transistors 20, 21, 25 and 26 are covered with the second interlayer insulator film 28. The first and second bit lines 8-1 and 8-2 are formed on the film 28.

As described above, the SRAM storage cell of the first embodiment that has the circuit of FIG. 6 is realized on the semiconductor substrate 1.

Fabrication Method

Next, a fabrication method of the storage cell of the first embodiment is described below.

First, by the local-oxidation of silicon (LOCOS) method, an $SiO_2$ film is selectively formed on the substrate 1 to form the field insulator film 2 as the isolation region, providing the active regions isolated by the isolation region, providing the active regions isolated by the isolation region on the substrate 1. An $SiO_2$ film is then formed selectively on the respective active regions at the corresponding positions to the gate electrodes 5a, 5b, 5c and 5d of the bulk MOS transistors 16, 17, 18 and 19, producing the gate insulator film 4 with the contact holes 3a and 3b.

Next, phosphorus (P) ions are selectively implanted into the substrate 1 to produce the $n^+$-type diffusion regions 64. A polysilicon film is then deposited on the gate insulator film 4 and is patterned to form the gate electrodes 5a, 5b, 5c and 5d of the bulk MOS transistors 16, 17, 18 and 19. Arsenic (As) ions are selectively implanted into the substrate 1 to produce the $n^+$-type diffusion regions 6a, 6b, 6c, 6d, 6e and 6f in self-align to the gate electrodes 5a, 5b, 5c and 5d, respectively.

A BPSG film is deposited on the gate insulator film 4 to cover the gate electrodes 5a, 5b, 5c and 5d by chemical vapor deposition (CVD) to produce the first interlayer insulator film 27.

The above process steps are the same as those of conventional one.

Subsequently, after contact holes 14a and 14b are provided, a polysilicon film is deposited on the first interlayer insulator film 27 and is patterned to produce the gate electrodes 9a and 9b. An $SiO_2$ film as the gate insulator film 10 is deposited on the first interlayer insulator film 27 by low-pressure CVD (LPCVD) to cover the gate electrodes 9a and 9b.

After forming the contact holes 24a and 24b in the film 10, an amorphous silicon film is deposited by CVD on the gate insulator film 10 to cover the gate electrodes 9a and 9b and is patterned. The amorphous film thus patterned is then annealed at 600° C. for 20 hours so that it is crystallized to be a polycrystalline silicon film with large-size grains. The polycrystalline silicon film thus obtained is subjected to a selective ion-implantation process of boron (B) to produce the $p^+$-type source and drain regions 11a and 12a, 11b and 12b, and the undoped channel regions 13a and 13b. The power supply line 15 is formed by the polycrystalline silicon film during the same process.

Further, a PZT film is deposited on the polycrystalline silicon film by sputtering for the second gate insulator films, and is patterned to form the contact holes 29a and 29b therein. A polysilicon film is deposited on the PZT film thus patterned. The PZT and polysilicon films are then patterned in the same process to produce selectively the stacked structure of the ferroelectric films 22 and the control electrodes 23a and 23b on the channel regions 13a and 13b, respectively.

A BPSG film is deposited on the gate insulator film 10 by CVD to cover the thin-film transistors 20, 21, 25 and 26 to produce the second interlayer insulator film 28. The film 28, the gate insulator film 10, the first interlayer insulator film 27 and the gate insulator film 4 are patterned to form the penetrating contact holes 7a and 7b.

An Al film is deposited on the second interlayer insulator film 28, and is patterned to produce the first and second bit lines 8-1 and 8-2.

Thus, the SRAM storage cell of the first embodiment is obtained.

Operation by a First Method

During the normal or regular operation, one of the first and second inverts produces a high level output "H" and the other produces a low output "L" to store a data value in the storage cell.

To maintain the content or data value of this storage cell after power is off, the cell is operated by the following way, so that this data value is maintained b the PZT films 22 for the first and second thin-film transistors 25 and 26 using the control electrodes 23a and 23b.

Let us consider here the case that the first thin-film transistor 20 is off and the second thin-film transistor 21 is on.

The threshold voltages of the MOS access transistors 16 and 17 are defined as $V_{te}$, which are, for example, 0.7 to 0.8 V. A voltage generator circuit (not shown) is provided, which produces a voltage of about $(V_{CC}+3\ V_{ta})$.

On a data-maintaining operation, a writing voltage $(V_{CC}+3\ V_{ta})$ from the voltage generator circuit is supplied to both the word line W and the second bit line 8-2. Since this voltage is applied to the gate electrodes 5c and 5d of the first and second access transistors 16 and 17, these trnasitors 16 and 17 become on. Therefore, the potential of the node B becomes equal to $(V_{CC}+2\ V_{ta})$ as the voltage $V_{CC}+3\ V_{ta}$ is applied to the drain of the transistor 17, which means that the node B is at a high level potential. Such the high potential $(V_{CC}+2\ V_{ta})$ is applied to the gate and control electrodes 9a and 23a of the thin-film transistor 20 and 25.

On the other hand, the first bit line 8-1 is grounded, or is reduced to 0 V in potential. Thus, the potential of the node A becomes equal to 0 V applied to the drain of the transistor 16, which means that the node A is at a low level potential. Such the low potential of 0 V is applied to the gate and control electrodes 9b and 23b of the thin-film transistor 21 and 26.

Since the supply voltage $V_{CC}$ is applied to the common source of the transistors 20 and 25, an electric field toward this common source is generated inside the PZT insulator film 22 for the transistor 25 due to the potential divergence $2\ V_{ta}$. Also, an electric field toward the gate electrode 23b is generated inside the PZT film 22 for the transistor 26 due to the potential difference $V_{CC}$.

As a result, the PZT films 22 for the transistors 25 and 26 are dielectrically polarized in opposite directions due to the above potential differences, respectively. The polarization strengths of the films 22 are dependent on the strengths of the corresponding electric fields.

Such the dielectric polarization causes the threshold voltages of the transistors 20 and 21 to shift in opposite polarities. In other words, the transistor 20 obtains the decreased threshold voltage and the transistor 21 obtains the increased threshold voltage, resulting in unbalance of the threshold voltages thereof.

Thus, the first thin-film transistor 20 becomes off and the second thin-film transistor 21 becomes on, which is independent of the initial states of the transistors 20 and 21. The above unbalance of the threshold voltage is kept by the dielectric polarization of the PZT films 22. Accordingly, even is power is off after such the data maintaining operation, the preceding written data value can be maintained.

When power is supplied again, the second transistor 21 tends to be on easier than the first transistors 20 due to the above threshold voltage unbalance. Hence, the drain of the transistor 21 increases faster in electric potential, so that the stored data value of the cell, i.e., the preceding states of the transistors 20 and 21 when power was off can be reproduced.

In other words, with the SRAM storage cell of the first embodiment, continuous power with a specified level is not essentially required for maintaining the stored data value.

Operation by a Second Method

In the first writing method above, the dielectric polarization is caused by applying a high electric potential to the word line W and to one of the bit lines 8-1 and 8-2 corresponding to the high potential level during a write operation. However, there is another method (the second method) without using such the high potential. In this second method, the data wiring process is realized by varying the supply voltage as follows:

First, a given data value is written in the cell through the normal or regular writing operation while keeping the supply voltage $V_{CC}$. Then, the supply voltage is raised up to 1.5 times $V_{CC}$, or $V_{CC}'$ ($V_{CC}'=1.5\ V_{CC}$), and the potential of the node B becomes $V_{CC}'$. After this potential stabilizes at $V_{CC}'$, the supply voltage is then decreased to 0.5 times $V_{CC}$, or $V_{CC}''$ ($V_{CC}''=0.5\ V_{CC}$). Thereafter, power is off.

During this operation, the second gate electrode 25 is momentarily kept at $V_{CC}'=1.5\ V_{CC}$ due to its parasitic capacitance or capacitances even if the supply voltage is reduced to $V_{CC}''$ (=0.5 $V_{CC}$), producing an electric field toward the common source of the transistors 20 and 25 within the PZT insulator film 22 corresponding to the electrode 25. Therefore, the threshold voltage of the first thin-film transistor 20 decreases in absolute value due to the dielectric polarization of the PZT film 22.

On the other hand, since the second gate electrode 26 is 0 V in potential, an electric field within the PZT insulator film 22 corresponding to the electrode 26 is kept toward the second gate electrode 26. Therefore, the thresohold voltage of the first thin-film transistor 20 decreases in absolute valued due to the dielectric polarization of the PZT film 22. Therefore, the threshold voltage of the second thin-film transistor 21 scarcely decreases due to the dielectric polarization of the PZT film 22.

As a result, the first and second thin-film transistors 20 and 21 obtain the unbalanced threshold voltages, so that even if power is off after such the data maintaining operation, the preceding written data value can be maintained. Also, when power is supplied again, the stored data value of the cell, i.e., the preceding states of the transistors 20 and 21 when power was off can be reproduced in the similar way as the first method.

To enhance the strength of the PZT dielectric polarization, preferably, the above sequence is repeated several times, and then, power is off.

Operation by a Third Method

There is still another method (the third method) without using such the high potential as the first method. In this third method, the data writing process is realized only by varying the supply voltage from $V_{CC}$ to 0 V as follows:

The second gate electrodes 23a and 23b are made of a material having a large resistivity such as 100 Ω·cm to 10 kΩ·cm to produce large parasitic resistances therein, resulting in increased time constants defined by these parasitic resistances and parasitic capacitances of the electrodes 23a and 23b.

If the supply voltage is abruptly reduced from $V_{CC}$ to 0 V with a rapid voltage-fall profile, the potential of the first control electrode 23a of the third transistor 25 decreases dependent on the above time constant. Since the supply voltage itself decreases faster than the potential of the electrode 23a dependent on a smaller time constant than those of the electrodes 23a and 23b, dielectric polarization of the PZT films 22 is caused to generate the threshold voltage difference between the first and second thin-film transistors 20 and 21.

As a result, even if power is off after such the data maintaining operation, the preceding written data value can be maintained. Also, when power is supplied again, the stored data value of the cell when power was off can be reproduced in the similar way as the first method.

At least two of the first, second and third methods may be combined.

In addition, considering the low driving capabilities of the p-type thin-film transistors 20 and 21, if the rising speed of the supply voltage is low when power is supplied again, the preceding data value can be reproduced without operation error, which provides improved reliability in data reproduction.

Second Embodiment

Figure 7A:
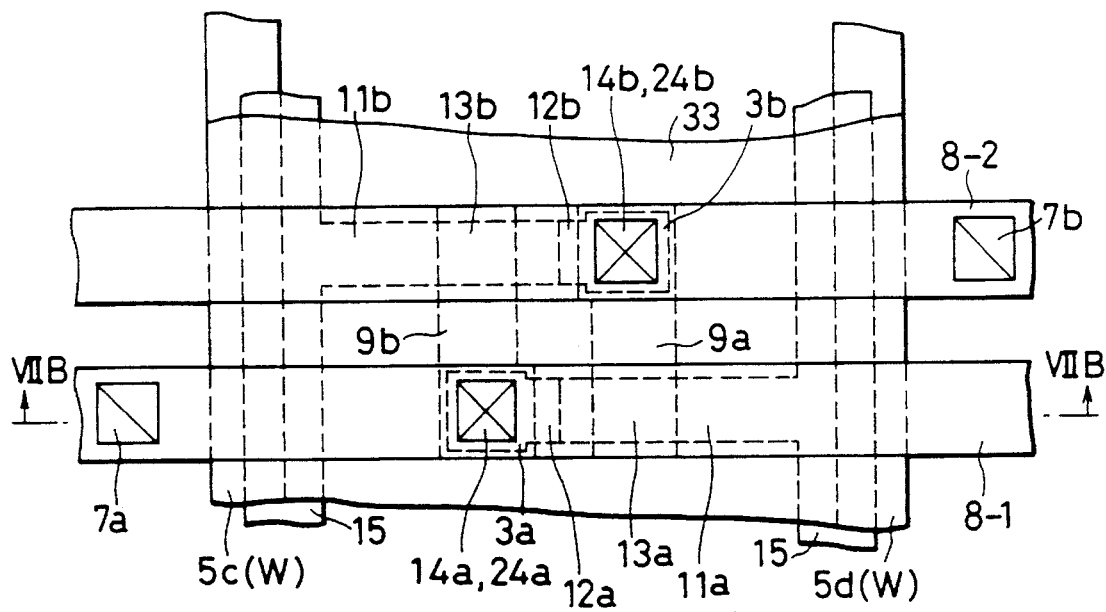
FIG. 7A is a partial plan view showing a storage cell of a semiconductor memory device according to a second embodiment of the invention.
Figure 7B:
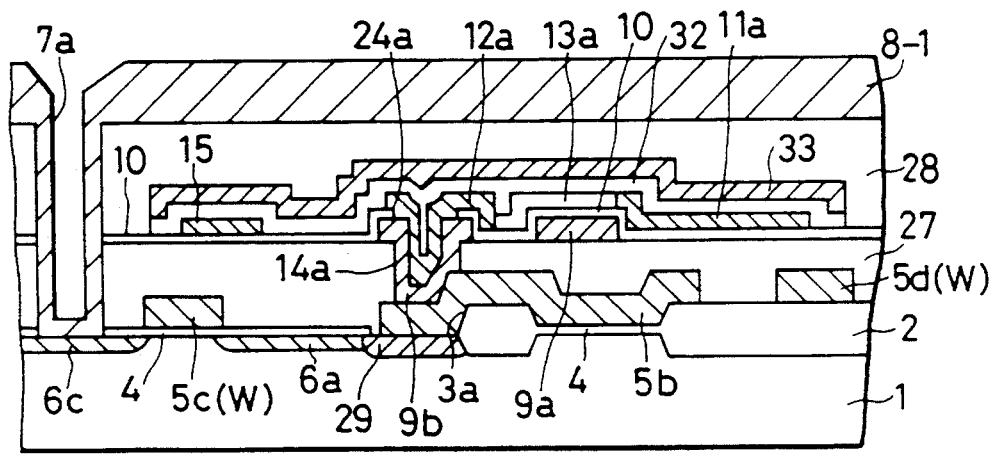
FIG. 7B is a partial cross-sectional view along the line IVB—IVB of FIG. 7A.
Figure 8:
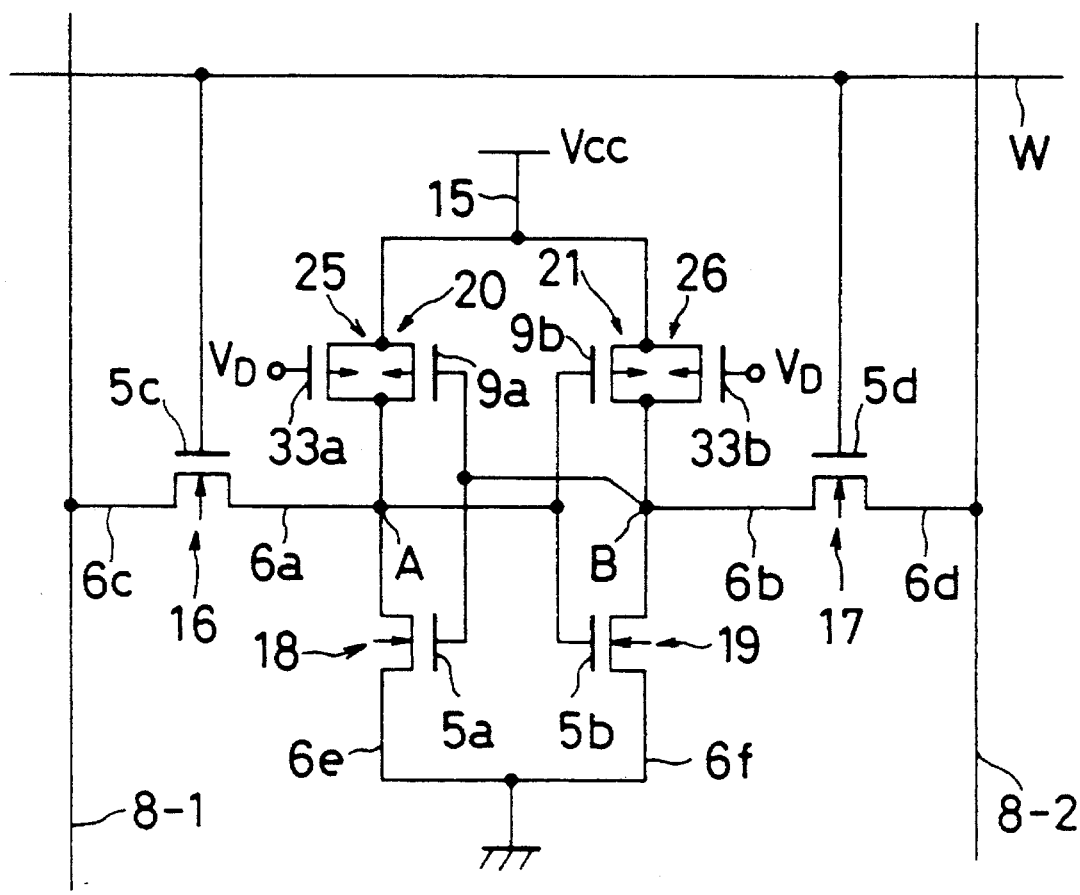
FIG. 8 is a circuit diagram of the storage cell of the semiconductor memory device according to the second embodiment.

FIGS. 7A and 7B show an SRAM according to a second embodiment of the invention, each storage cell of which has a circuit diagram shown in FIG. 8.

Circuit

As shown in FIG. 8, the second embodiment is the same in circuit diagram as the first embodiment (FIG. 6) except for control electrodes 33a and 33b of the third and fourth thin-film transistors 25 and 26. The electrodes 33a and 33b are not connected to the gate electrodes 9a and 9b, respectively, in other words, they are isolated. Also, the electrodes 33a and 33b are applied with the same voltage $V_D$.

Structure

The above circuit configuration is realized on the substrate 1 as shown in FIGS. 7A and 7B. A polycrystalline silicon film for forming the source and drain regions 11a and 12a and the channel region 13a is selectively deposited on the gate insulator film 10 to cover the first gate electrodes 9a and 9b and the power supply line 15. A PZT film 32 is deposited on the entirety of the polycrystalline silicon film by sputtering. A polysilicon film 33 is deposited on the entirety of the PZT film 32. The polysilicon film 33 and the PZT film 32 are patterned to produce the control electrodes 33a and 33b.

Here, the control electrodes 33a and 33b are formed by the single film 33 so that they are coupled together. The film 33 is connected with a wiring layer (not shown) for supplying a specified control voltage $V_D$ to the film 33. This wiring layer may be made of a conductive film such as a polysilicon one in the same level as that of the first and second bit lines 8-1 and 8-2. The wiring layer is provided for the storage cells that belong to the same word line W.

Operation

During normal or regular operation, the control voltage $V_D$ is set equal to the supply voltage $V_{CC}$, so that the third and fourth transistors 25 and 26 are off. Also, one of the first and second inverters produces a high level output "H" and the other produces a low output "L" to store a data value in the storage cell in the same way as that of the conventional one.

To maintain the content or data value of this storage cell after power is off, the control voltage is reduced from $V_D$ to 0 V. Thus, the PZT film 32 acting as the second gate insulator film for the transistors 25 and 26 is dielectrically polarized according to the relationship between the potentials of the transistors 25 and 26 and $V_D$, so that the threshold voltage of the transistor 25 decreases and that of the transistor 26 increases in absolute value.

In detail, because the potential of the node B is 0 V or grounded, the common channel region 13a of the first and third thin-film transistors 20 and 25 is at an on-state and the potential of the common drain region 12a is also $V_{CC}$, or at a high level, Therefore, the potential of the channel region 13a is equal to the supply voltage $V_{CC}$. When the control voltage is reduced from $V_D$ to 0 V or the ground, an electric field is applied to the PZT second gate insulator film 32 so that the threshold voltage of the transistor 25 decreases in absolute value.

On the other hand, because the potential of the node A is $V_{CC}$, the common channel region 13b of the second and fourth thin-film transistors 21 and 26 is at an off-state and the potential of the common drain region 12b is about 0 V, or at a low level. When the control voltage is equal to $V_{CC}$, an electric field is applied to the PZT second gate insulator film 32 so that the threshold voltage of the transistor 26 increases in absolute value due to the dielectric polarization of the film 32. Even if the control voltage is reduced from $V_D$ to 0 V or the ground, the orientation of the electric field does not change so that the polarization does not change.

When power is off, the shift or unbalance of the threshold voltages of the transistors 20 and 21 is maintained due to the dielectric polarization. Thus, when power is supplied again, the second transistor 21 tends to be on more difficulty then the first transistors 20 due to the above threshold voltage unbalance. Hence, the drain of the transistor 26 decreases and that of the transistor 25 increases in electric potential. This means that the stored data value or the preceding states of the transistors 20 and 21 when power was off can be reproduced.

In addition, considering the low driving capabilities of the p-type thin-film transistors 20 and 21, if the rising speed of the supply voltage is low when power is supplied again, the preceding data value can be reproduced without operation error, which provides improved reliability in data reproduction, similar to the first embodiment.

As described above, the storage cells of the first and second embodiments enable the SRAMs non-volatile. Also, there is additional advantage that the preceding data value can be reproduced in spite of noise due to radioactive rays such as the α-particles.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A semiconductor memory device containing a plurality of storage cells, each of said cells comprising:

a first CMOS inverter having a first input end and a first output end;

a second CMOS inverter having a second input end and a second output end;

said first input end being connected with said second output end and said second input end being connected with said first output end;

said first inverter and said second inverter constituting a flip-flop circuit;

said first CMOS inverter being composed of a first MOS driver transistor of a first conductivity type and a first pair of thin-film transistors of a second conductivity type opposite in polarity to said first conductivity type; and said first pair of thin-film transistors having a first pair of source/drain regions, a first channel region formed between said first pair of source/drain regions, a first gate electrode formed to be opposite to said first channel region through a first gate insulator film, and a first control electrode formed to be opposite to said first channel region through a first ferroelectric insulator film;

said second CMOS inverter being composed of a second MOS driver transistor of a first conductivity type and a second pair of thin-film transistors of a second conductivity type opposite in polarity to said first conductivity type;

said second pair of thin-film transistors having a second pair of source/drain regions, a second channel region formed between said second pair of source/drain regions, a second gate electrode formed to be opposite to said second channel region through a second gate insulator film, and a second control electrode formed to be opposite to said second channel region through a second ferroelectric insulator film;

wherein said first and second ferroelectric insulator films are dielectrically polarized by applying voltages to said first and second control electrodes, so that a threshold voltage difference is generated between said first and second pairs of thin-film transistors; and wherein a content of said storage cell is maintained due to said threshold voltage difference.

2. The device as claimed in claim 1, wherein said first gate electrode and said first control electrode are coupled together and said second gate electrode and said second control electrode are coupled together.

3. The device as claimed in claim 1, wherein said first gate electrode and said first control electrode are not coupled together, said first control electrode being applied with a control voltage;

and wherein said second gate electrode and said second control electrode are not coupled together, said second control electrode being applied with a control voltage.

4. The device as claimed in claim 1, wherein said first and second control electrodes are coupled together to be applied with a control voltage.

5. The device as claimed in claim 1, wherein dielectric polarization of said first and second ferroelectric films are generated by varying a supply voltage to said storage cell after a data value is stored in said storage cell.

6. The device as claimed in claim 1, wherein dielectric polarization of said first and second ferroelectric films are generated by varying voltages applied to said first and second control electrodes after a data value is stored in said storage cell.

7. The device as claimed in claim 1, wherein said first gate electrode and said first control electrode of said first pair of thin-film transistors are placed at each side of said first channel region of said first pair of thin-film transistors, and said second gate electrode and said second control electrode of said second pair of thin-film transistors are placed at each side of said second channel region of said second pair of thin-film transistors.

8. The device as claimed in claim 1, wherein said first and second ferroelectric films are made of PZT.

9. In a semiconductor memory device containing a plurality of storage cells, each of said cells comprising:

a first CMOS inverter having a first input end and a first output end;

a second CMOS inverter having a second input end and a second output end;

said first input end being connected with said second output end and said second input end being connected with said first output end;

said first inverter and said second inverter constituting a flip-flop circuit;

wherein said first CMOS inverter contains a first pair of thin-film transistors and said second CMOS inverter contains a second pair of thin-film transistors;

and wherein said first pair of thin-film transistors having a first channel region formed between a first pair of source/drain regions, a first gate insulator film formed at one side of said first channel region, a first gate electrode formed on said first gate insulator film, a first ferroelectric insulator film formed at another side of said first channel region, and a first control electrode formed on said first ferroelectric insulator film;

and wherein said second pair of thin-film transistors having a second channel region formed between a second first pair of source/drain regions, a second gate insulator film formed at one side of said second channel region, a second gate electrode formed on said second gate insulator film, a second ferroelectric insulator film formed at another side of said second channel region, and a second control electrode formed on said second ferroelectric insulator film;

and wherein said first and second ferroelectric insulator films are dielectrically polarized by applying voltages to said first and second control electrodes, so that a threshold voltage difference is generated between said first and second pairs of thin-film transistors, maintaining a content of said storage cell due to said threshold voltage difference.

10. The device as claim in claim 9, wherein said first gate electrode and said first control electrode are coupled together and said second gate electrode and said second control electrode are coupled together.

11. The device as claimed in claim 9, wherein said first gate electrode and said first control electrode are not coupled together, said first control electrode being applied with a control voltage;

and wherein said second gate electrode and said second control electrode are not coupled together, said second control electrode being applied with a control voltage.

12. The device as claimed in claim 9, wherein said first and second control electrodes are coupled together to be applied with a control voltage.

13. The device as claimed in claim 9, wherein dielectric polarization of said first and second ferroelectric films are generated by varying a supply voltage to said storage cell after a data value is stored in said storage cell.

14. The device as claimed in claim 9, wherein dielectric polarization of said first and second ferroelectric films are generated by varying voltages applied to said first and second control electrodes after a data value is stored in said storage cell.

15. The device as claimed in claim 9, wherein said first gate electrode and said first control electrode of said first pair of thin-film transistors are placed at each side of said first channel region of said first pair of thin-film transistors, and said second gate electrode and said second control electrode of said second pair of thin-film transistors are placed at each side of said second channel region of said second pair of thin-film transistors.

16. The device as claimed in claim 9, wherein said first and second ferroelectric films are made of PZT.

\* \* \* \* \*

UNITED STATES PATENT AND TRADEMARK OFFICE
CERTIFICATE OF CORRECTION

PATENT NO. : 5,535,154
DATED : July 9, 1996
INVENTOR(S) : Junji KIYONO

It is certified that error appears in the above-indentified patent and that said Letters Patent is hereby corrected as shown below:

Column 9, line 6, delete "the active regions isolated by the isolation region, providing".

Column 10, line 6, delete "inverts" and insert --inverters--.

Signed and Sealed this

Nineteenth Day of November, 1996

Attest:

BRUCE LEHMAN

*Attesting Officer*  *Commissioner of Patents and Trademarks*